United States Patent [19]

Bernstein

[11] Patent Number: 5,693,181
[45] Date of Patent: Dec. 2, 1997

[54] METHOD OF MAKING TRANSDUCER CHIPS WITH GROOVES ON THE WAFER FOR EASY SEPARATION OF THE CHIPS

[75] Inventor: Jonathan J. Bernstein, Medfield, Mass.

[73] Assignee: The Charles Stark Draper Laboratory, Inc., Cambridge, Mass.

[21] Appl. No.: 642,457

[22] Filed: May 3, 1996

Related U.S. Application Data

[62] Division of Ser. No. 289,688, Aug. 12, 1994, Pat. No. 5,596,222.

[51] Int. Cl.[6] ................................. H01L 21/00
[52] U.S. Cl. ..................... 156/644.1; 156/659.1; 156/662.1; 437/226; 148/DIG. 28
[58] Field of Search ..................... 156/644.1, 659.1, 156/662.1; 437/226; 148/DIG. 28

[56] References Cited

U.S. PATENT DOCUMENTS

| | | | |
|---|---|---|---|
| 4,904,617 | 2/1990 | Muschke | 437/129 |
| 4,961,821 | 10/1990 | Drake et al. | 156/647 |
| 5,196,378 | 3/1993 | Bena et al. | 437/226 |
| 5,385,635 | 1/1995 | O'Neill | 156/647 |
| 5,418,190 | 5/1995 | Cholewa et al. | 437/226 |

OTHER PUBLICATIONS

Wolf, "Silicon Processing for the VLSI Era vol. 1–Process Technology", pp. 531–532, (1986).

*Primary Examiner*—Thi Dang
*Attorney, Agent, or Firm*—Iandiorio & Teska

[57] ABSTRACT

A wafer and a method of making a wafer containing a plurality of severable transducer chips includes a wafer; a plurality of transducer chips formed on the wafer; and a grid of longitudinal and latitudinal grooves in the wafer for separating the chips from each other and enabling them to be easily, individually severed from the wafer, as well as a transducer chip and a method of making it, having integral raised contacts adapted for a flip chip or beam lead interconnection, with a transducer formed on the chip; and a plurality of raised contacts integrally formed with the chip and electrically interconnected with the transducer.

10 Claims, 8 Drawing Sheets

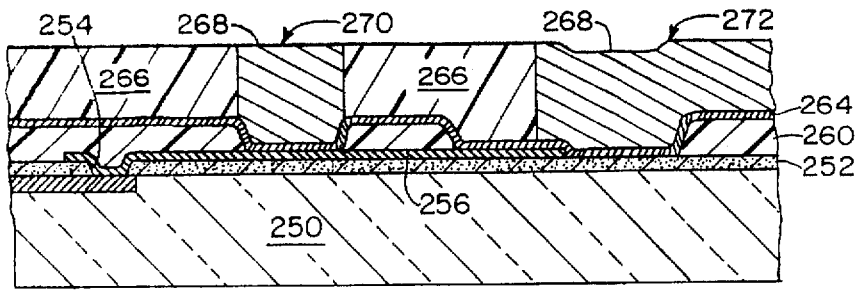
Fig. 23
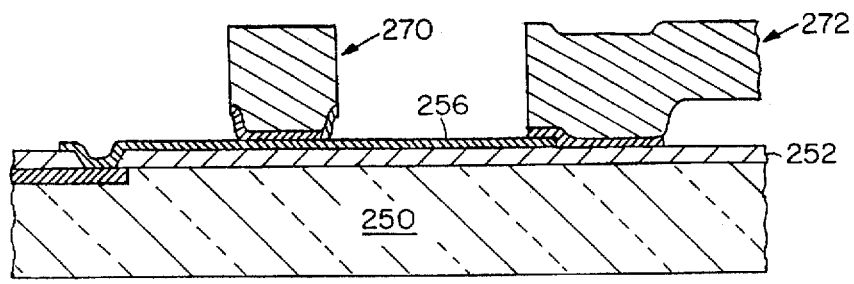
Fig. 24
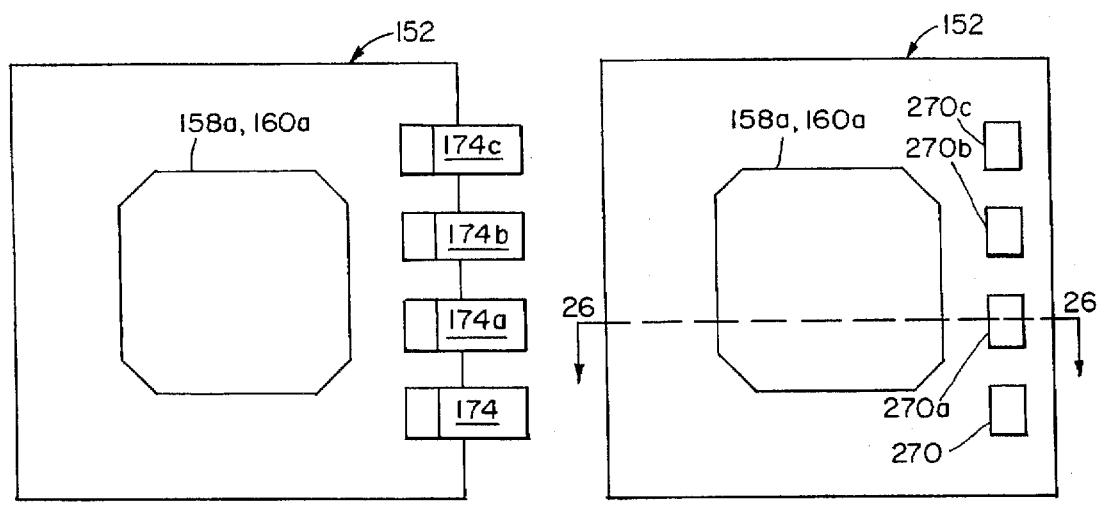
Fig. 17
Fig. 25
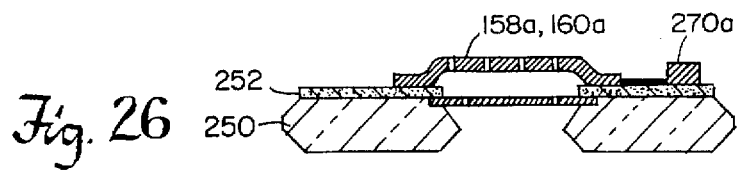
Fig. 26

METHOD OF MAKING TRANSDUCER CHIPS WITH GROOVES ON THE WAFER FOR EASY SEPARATION OF THE CHIPS

This is a division of application Ser. No. 08/289,688, filed Aug. 12, 1994, now U.S. Pat. No. 5,596,222.

FIELD OF INVENTION

This invention relates to an improved wafer and method of making the wafer containing a plurality of easily separable transducer chips and containing beam leads and bump contacts.

BACKGROUND OF INVENTION

Conventional multi-chip wafers containing a plurality of chips, for example transducer chips such as monolithic silicon acoustic transducers or microphones, are separated into the separate chips by means of wafer sawing. In addition to generating sawdust waste, such wafer sawing operations are expensive, time consuming, and require the use of expensive machines and labor. More importantly, perhaps, wafers in this advanced state of fabrication are very valuable and very delicate products which could be damaged or destroyed in the sawing operation. Conventional chips also require wire bonding to connect the on-board transducer and attendant circuitry with associated external circuits and components. This is a tedious and delicate task which is time consuming and can damage the chip or disable the electrical circuitry.

SUMMARY OF INVENTION

It is therefore an object of this invention to provide an improved wafer and method of making it.

It is a further object of this invention to provide such an improved wafer which contains a plurality of easily separable transducer chips.

It is a further object of this invention to provide such an improved wafer which enables the chips to be quickly, easily, inexpensively, and safely separated from the wafer without waste, without expensive machines, material or labor, and without danger of damaging the chip or disabling the electrical circuitry.

It is a further object of this invention to provide such an improved wafer which provides simple, inexpensive interconnection to external components and circuits.

It is a further object of this invention to provide such an improved wafer which eliminates the need for wire bonding interconnections.

The invention results from the realization that an improved wafer and method of making it can be achieved by providing a grid of longitudinal and latitudinal grooves on the wafer which weaken it in the area of those grooves so that the chips can be quickly, easily, inexpensively, and safely separated from the wafer without waste, without expensive machines, material or labor, and without danger of damaging the chip or disabling the electrical circuitry, and the further realization that wire bonding interconnection can be achieved by using beam leads and bump contacts which can be integrally, monolithically fabricated with the wafer and transducer.

This invention features a wafer containing a plurality of severable transducer chips. There is a wafer, a plurality of transducer chips formed on the wafer, and a grid of longitudinal and latitudinal grooves in the wafer for separating the chips from each other and enabling them to be easily, individually severed from the wafer.

In a preferred embodiment the grooves may be V shaped, being wider at the surface of the wafer and narrowing as they penetrate inwardly. The grooves may be disposed on both surfaces of the wafer. The grooves may be continuous in one of the longitudinal and latitudinal directions and discontinuous in the other, to provide gaps which isolate the respective grooves for preventing undercutting at the corner. The grooves may be disposed on both surfaces of the wafer and the longitudinal and latitudinal grooves on each surface may be aligned with like grooves on the other surface to reduce the width required for the grooves on the surfaces. The longitudinal grooves may be continuous and the latitudinal grooves discontinuous on one surface of the wafer while the latitudinal grooves may be continuous and the longitudinal grooves discontinuous on the other surface of the wafer.

The invention also features a method of making a plurality of separable semiconductor transducer chips on a wafer. The method includes applying an etch resistant mask to at least one surface of the wafer to define a grid of longitudinal and latitudinal channels to be etched. An etchant is applied to the wafer to etch into the channels to form a pattern of longitudinal and latitudinal grooves for separating the chips from each other and enabling them to be easily individually severed from the wafer.

In a preferred embodiment the wafer may be silicon. The mask may be formed from the group consisting of silicon dioxide, silicon nitride, boron doped silicon, silicon carbide, titanium, palladium, platinum and gold. The etchant may include ethylene-diamine-pyrocatechol or potassium hydroxide.

The invention also features a transducer chip having integral raised contacts adapted for flip chip or beam lead interconnection. There is a transducer chip and a transducer formed on the chip. A plurality of raised contacts are integrally formed with the chip and electrically interconnected with the transducer.

In a preferred embodiment the chip may be made of silicon. The transducer may include signal conditioning circuitry interconnecting the transducer and contacts. The contacts may include bump bonds or beam leads. The beam leads may extend above and beyond the edge of the chip.

The invention also features a method of making on a transducer chip raised integral contacts for beam lead or flip chip interconnection. The method includes applying to a transducer chip having an insulator layer a first metal layer. An electrical conducting plating base is applied on the transducer chip over the first metal layer. A plating mask is applied over the areas of the chip to be devoid of contacts and a second thicker metal layer is applied in the unmasked areas to create raised contacts for interconnecting with the transducer through the plating base and second metal layer. The remainder of the mask and the exposed portion of the plating base are removed.

In a preferred embodiment the contact may be a bump bond or a beam lead. A spacer layer may be applied before applying the plating base to enable the beam lead to be spaced above the surface of the chip.

DISCLOSURE OF PREFERRED EMBODIMENT

Other objects, features and advantages will occur to those skilled in the art from the following description of a preferred embodiment and the accompanying drawings, in which:

FIG. 17 is a top plan view showing the location of the beam leads according to this invention;

FIGS. 18–24 illustrate the steps in forming the beam leads according to this invention;

FIG. 25 is a top plan view similar to FIG. 19 showing bump bonds fabricated according to this invention; and FIG. 26 is a side elevational sectional view along line 26–26 of FIG. 25.

Figure 1:
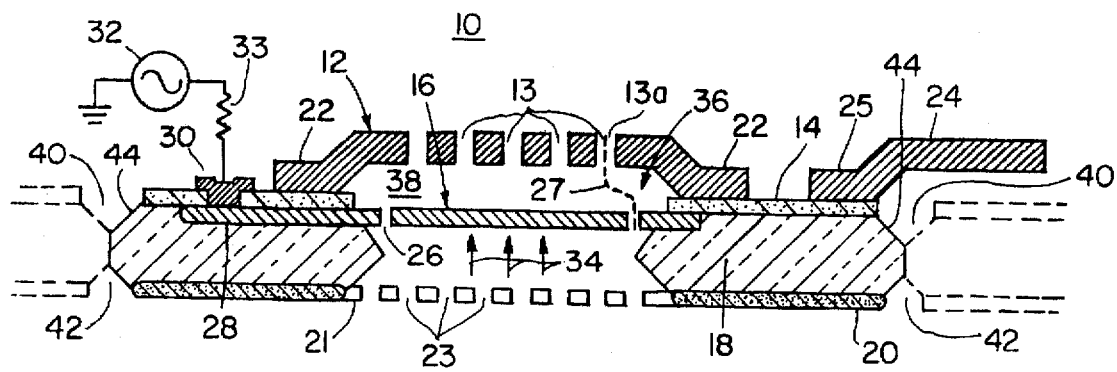
FIG. 1 is a schematic side elevational cross-sectional view taken along line 1—1 of FIG. 2 of an acoustic transducer according to this invention.

There is shown in FIG. 1 an acoustic transducer 10 according to this invention which includes a perforated plate or member, electrode 12, having perforations 13 and being mounted to insulating layer 14. Movable plate or diaphragm 16 is mounted to substrate 18. Insulating layer 14 may be made of silicon oxide or silicon nitride. Substrate 18 may be silicon. The layer 20 on the bottom of substrate 18 is an etch stop layer, typically a P+ diffusion layer or silicon oxide or nitride. Perforated member 12 is a conductive electrode mounted on insulating layer 14 by means of footings 22. External connections are made through beam leads 24 attached to insulator layer 14 by means of anchors 25. Diaphragm 16 includes a pressure equalization slot 26 and is connected via conductor 28 to contact 30. Fluid entering slot 26 must follow a tortuous path 27 which bends or deflects and is lengthened in order to enter a perforation 13a. This is done intentionally to further increase the resistance seen by fluid flowing through slot 26 in order to enhance the low frequency performance of the transducer. An electric field is applied across perforated bridge electrode member 12 and diaphragm 16 by an a.c. or d.c. voltage source 32 which is connected through a series resistor 33 to diaphragm contact 30.

In operation, when acoustic wave energy, arrows 34, is incident on diaphragm 16, it is urged closer to perforated member 12. This changes the overall capacitance between diaphragm 16 and member 12 in the electric field produced by a.c. voltage generator 32. The change in capacitance provides a variation or modulation of the voltage provided by voltage generator 32 and this can be detected as a representation of the incident acoustic wave energy. The space 36 between perforated bridge electrode member 12 and diaphragm 16 is filled with a dielectric fluid 38. Since the capacitance of the device is proportional to the dielectric constant of the fluid 38 in space 36, the higher the dielectric constant the better will be the signal obtained. If the device is operated as a microphone the dielectric fluid will typically be air. If it is a hydrophone, for example, a nonconductive fluid would be used. If the specific gravity of the fluid is matched to that of the movable plate then errors due to motion of the plate responsive to acceleration forces will be reduced.

Figure 2:
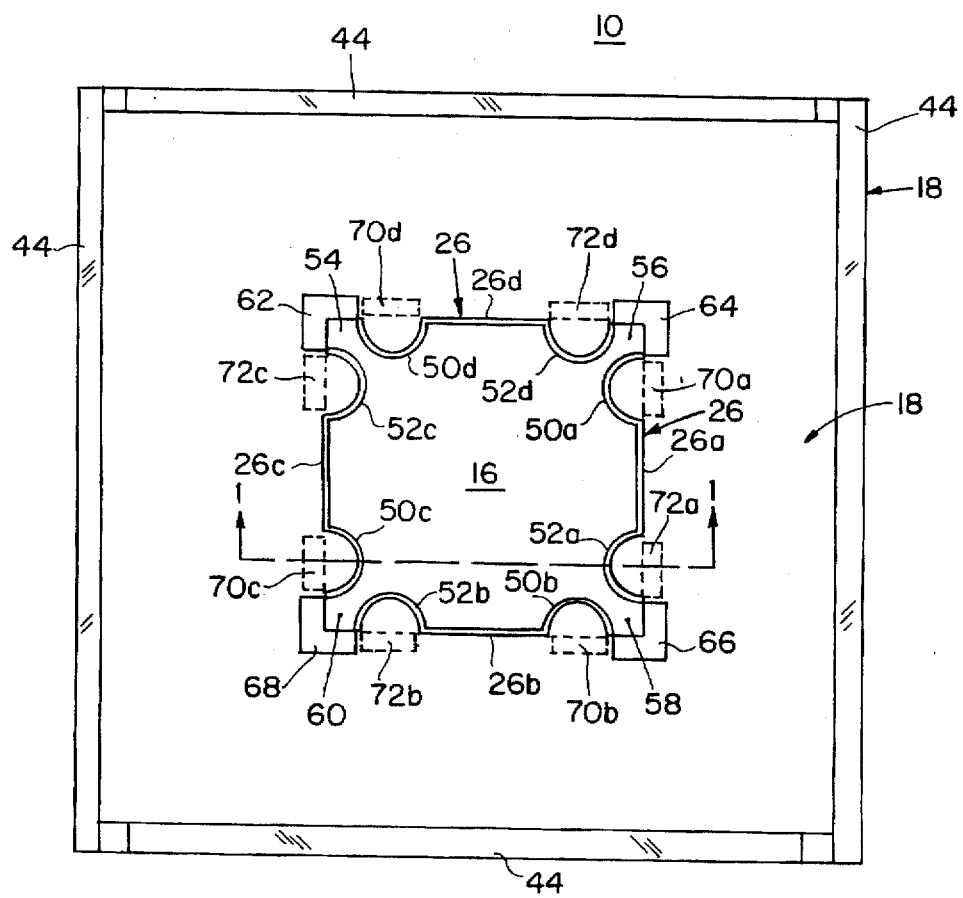
FIG. 2 is a top plan view of the acoustic transducer of FIG. 1 with the perforated bridge electrode, beam leads and insulating layer removed.
Figure 1A:
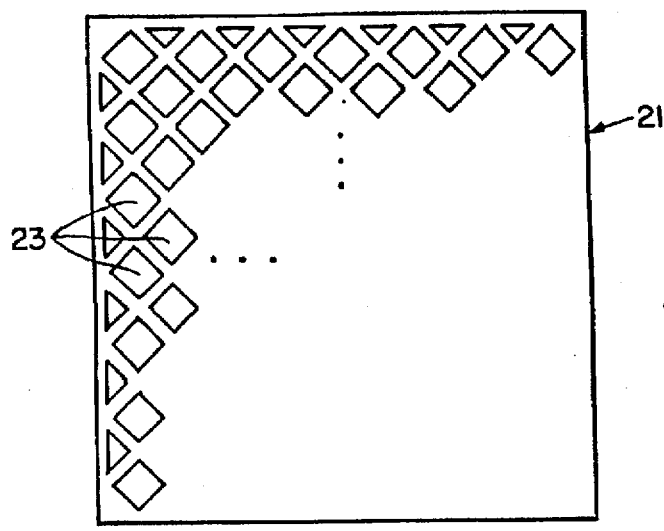
FIG. 1A is an enlarged bottom plan view of the perforated plate of the acoustic transducer of FIG. 1.

In a preferred construction the substrate 18 and diaphragm 16 and springs 54, 56, 58 and 60, FIG. 2, are all made of silicon. The dielectric fluid, alternatively to being air, may be freon, oil, or any other insulating fluid. Typically the transducer is constructed by micromachining photolithographic processes. The silicon areas to be protected during etching are doped with boron. An etchant such as EDP is used. Pressure equalizing passage, slot 26, permits any changes in pressure in the medium in which the transducer is immersed, e.g., air or water, to equalize on both sides of the diaphragm 16.

Upper and lower V grooves 40, 42 are etched in substrate 18 during the fabrication process in order to allow easy separation of individual segments when that is desirable. These V grooves expose chamfered edges 44 which can be seen more clearly in FIG. 2, where the full course of slot 26 can be seen as including four sections 26a, b, c, d. Each section 26a–d of slot 26 takes on a curved portion 50a, 52a, 50b, 52b, 50c, 52c, and 50d, 52d, which define four springs 54, 56, 58 and 60. Springs 54–60 are attached to substrate 18 by corner anchors 62, 64, 66 and 68, respectively. The remainder of diaphragm 16 is made independent from substrate 18 by virtue of slots 26a–d. Thus slot 26 functions as a pressure equalization passage and as a means to separate the diaphragm 16 from substrate 18 and create springs 54–60. In this way, even though diaphragm 16 may be made of stiff material such as gold, nickel, copper, silicon, iron, polycrystalline icon, silicon dioxide, silicon nitride, silicon carbide, titanium, chromium, platinum, palladium or aluminum, and alloys thereof, the needed flexibility can still be obtained and closely controlled by the separation of diaphragm 16 from substrate 18 and the shaping and sizing of springs 54–60 through the arrangement of slot 26. Bridge electrode member 12 may be made of the same materials.

The corner anchors 62–68 and the diaphragm 16 may be P+ boron doped areas, while the surrounding portion of substrate 18 is an N- type region. The areas 70a, 72a, 70b, 72b, 70c, 72c, 70d, and 72d associated with each of the curved portions 50a, 52a–50d, 52d are also P+ boron doped regions. The PN junction thus created isolates the two regions electrically.

Figure 3:
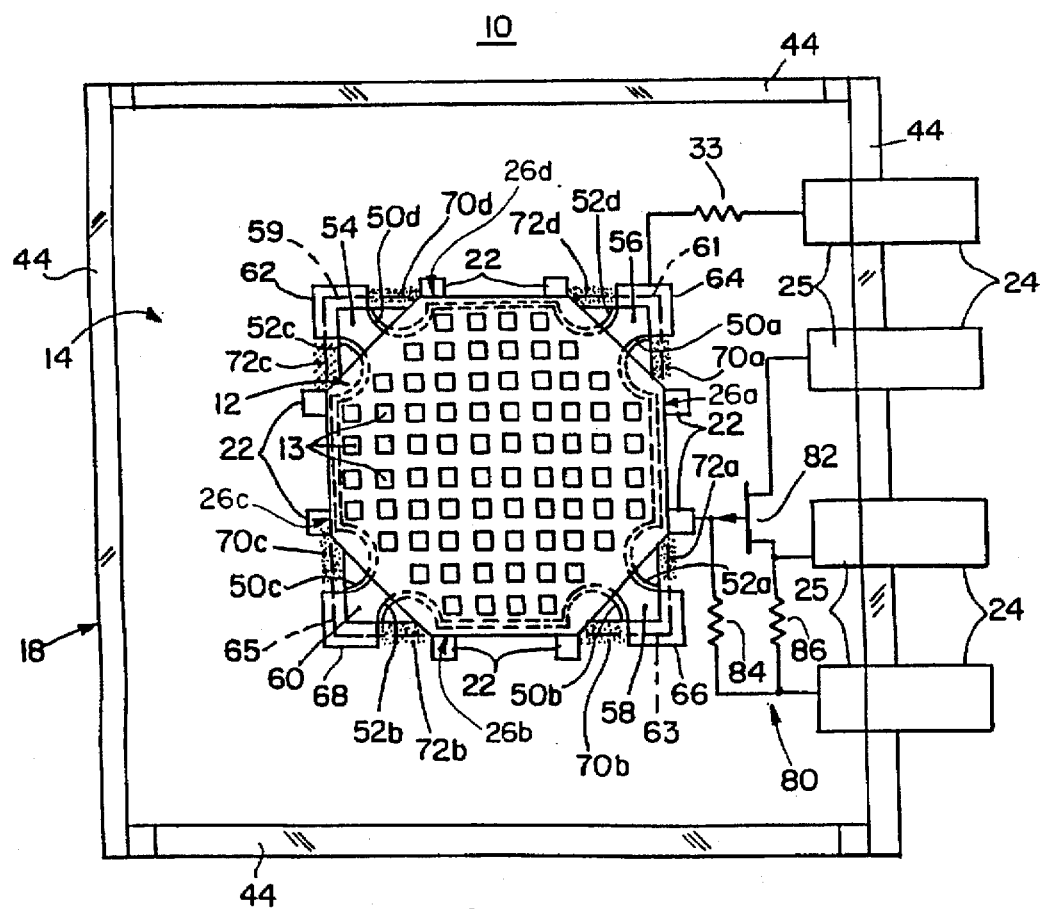
FIG. 3 is a top plan view similar to FIG. 2 with the beam leads, perforated bridge electrode and attendant circuitry present.

The extent to which slot 26 is unaligned with perforations 13 can be seen more clearly in FIG. 3, where no portion of slots 26a–d covered by bridge electrode member 12 are aligned with any of the perforations 13. It is only the small portions of the curved sections 50a, 52a–50d, 52d that are not covered by bridge electrode 12 which avoid a torturous path. Bridge electrode 12 is fastened to insulating layer 14 by bridge electrode footings 22. Electrical connection to diaphragm 16 is made through resistor 33 via corner anchor 64 and the anchor 25 of one of the beam leads 24. The connection to bridge electrode 12 is made through the anchors 25 of the other three beam electrodes 24 which actually interconnect through a source follower circuit 80 which includes FET transistor 82 and biasing resistors 84 and 86.

Figure 4:
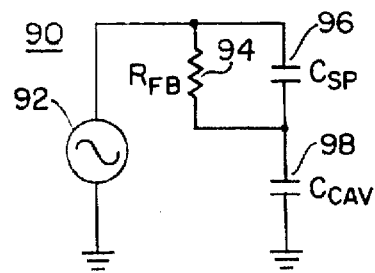
FIG. 4 is a low-frequency equivalent circuit model of the acoustic transducer of FIGS. 1–3.

The problem of making an acoustic transducer in a small package with a good low frequency response can better be understood with reference to an equivalent circuit model 90, FIG. 4, of the acoustic transducer where the incident pressure wave is represented by source 92. The resistance of slot 26 is represented by resistor $R_{FB}$, 94; the compliance, $C_{SP}$, of the springs is represented by capacitor 96; and the compliance, $C_{CAV}$, of the cavity is represented by capacitor 98. The cavity compliance can be expressed as:

$$C_{CAV} = \frac{V_{CAV}}{\rho c^2} \tag{1}$$

The spring compliance can be expressed in terms of the diaphragm area S and diaphragm linear spring constant $k_{sp}$, as:

$$C_{sp} = \frac{S^2}{k_{sp}} \tag{2}$$

Preferably the cavity compliance $C_{CAV}$ is three or more times greater than the spring compliance $C_{sp}$ so that the cavity volume will have a small effect on the sensitivity and resonant frequency. From equations (1) and (2), it is apparent that the minimum package volume $V_{CAV}$ which may be calculated from the air bulk modulus ($\rho c^2$), the area of diaphragm 16, S(m$^2$) and the linear spring constant $k_{sp}$(N/m) can be expressed as:

$$V_{CAV} \geq \frac{3\rho c^2 S^2}{k_{sp}} \tag{3}$$

From equation (3) it can be seen that the necessary cavity volume rises vary rapidly with diaphragm diameter ($d^4$), assuming a constant spring constant. Thus if system volume is a constraint then Equation (3) may cause a constraint on the size of the diaphragm. The acoustic low frequency limit, that is, the low frequency corner or 3 dB roll-off point of the transducer, as shown in the equivalent circuit of FIG. 4, is set by the RC time constant of the pressure equalization slot 26 and the compliances of the cavity volume and diaphragm springs $C_{CAV}$, $C_{SP}$:

$$f_L = \frac{1}{2\pi R_{FB}(C_{CAV} + C_{SP})} \tag{4}$$

Table I shows four design cases A–D for various cavity volumes, resonant frequencies, and diaphragm diameters.

TABLE 1

Microphone design cases used for slot-width simulation.

| Case | Cavity Volume (mm$^3$) | Resonant Frequency (Hz) | Diaphragm Diameter (mm) |
|---|---|---|---|
| A | 27 | 8 kHz | 1 |
| B | 8 | 8 kHz | 1 |
| C | 27 | 8 kHz | 1.8 |
| D | 27 | 22 kHz | 1.8 |

Figure 5:
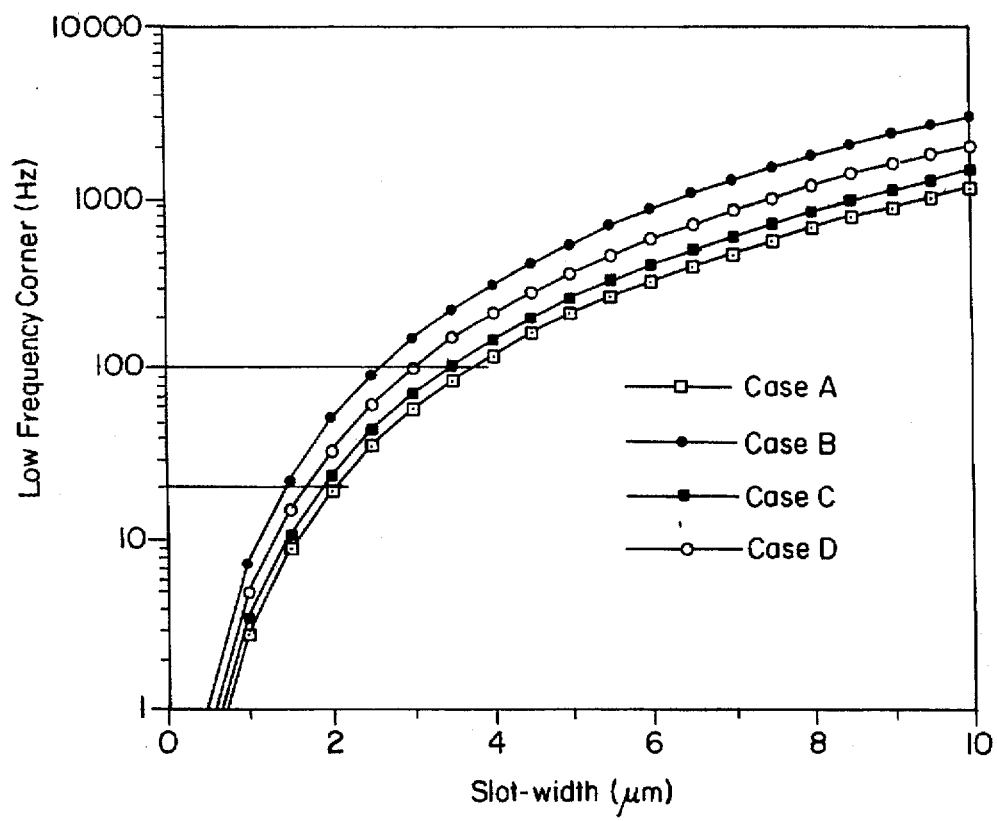
FIG. 5 depicts a family of curves illustrating the variation in low-frequency corner frequency with slot width for four different cavity volume, resonant frequency, and diaphragm diameter conditions.

The results are graphically illustrated in FIG. 5, where the low frequency corner frequency or 3 dB roll-off point is the ordinate dimension and the width of the pressure equalization slot is the abscissa dimension. There it can be seen that the low frequency roll-off point decreases dramatically with decrease in slot width. A slot width of 0.1 to 10 microns provides good low end frequency response. A range of slot width from approximately 0.5 microns to 5.0 microns is preferred.

Figure 6:
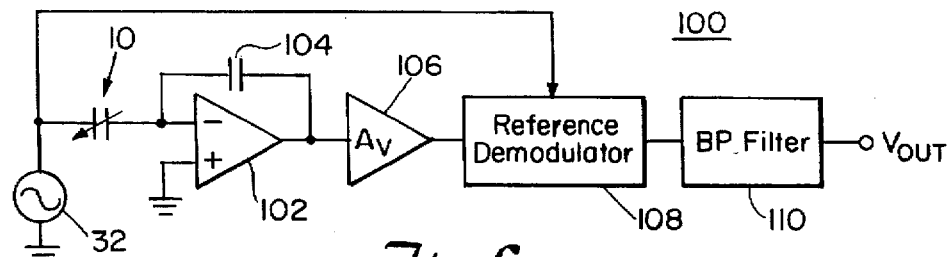
FIG. 6 is a schematic diagram of an a.c. detection circuit for use with the acoustic transducer according to this invention.

Transducer 10 may be employed in a detection circuit 100, FIG. 6, in which the a.c. signal generator 32 operates as a local oscillator at, for example, 100 kilocycles or more. Then variations in the capacitance in transducer 10 causes modulation of the 100 KHz carrier wave. Amplifier 102 with feedback impedance 104 amplifies the modulator carrier signal in the 100 KHz band. After further amplification in amplifier 106 the signal is synchronously demodulated in demodulator 108 using a reference signal derived from a.c. signal generator 32 to extract the modulating signal representing the capacitance fluctuation of transducer 10. The detected signal representative of the variation in capacitance and thus the strength of the incident acoustic wave energy may be further treated in bandpass filter 110 to remove any d.c., carrier and carrier harmonic components, and ultimately provide the output signal $V_{OUT}$.

Figure 7:
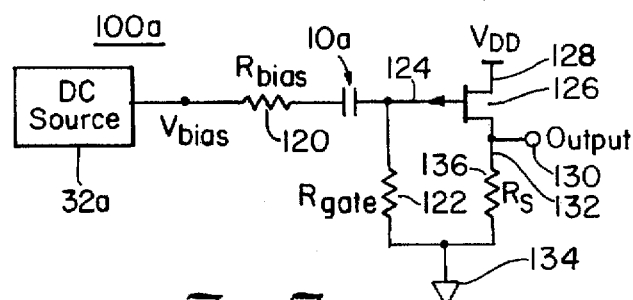
FIG. 7 is a schematic diagram of a d.c. detection circuit for use with the acoustic transducer according to this invention.

In a preferred d.c. detection circuit 100a, FIG. 7, d.c. source 32a provides a d.c. bias, $V_{bias}$, through bias resistor 120 to transducer 10a. Gate resistor 122 sets the voltage at the gate 124 of FET 126. A bias voltage, $V_{dd}$, which can be the same as $V_{bias}$ is applied to the drain electrode 128 and the output 130 is taken from the source electrode 132 which is connected to grounds 134 through source resistor 136.

Figure 8:
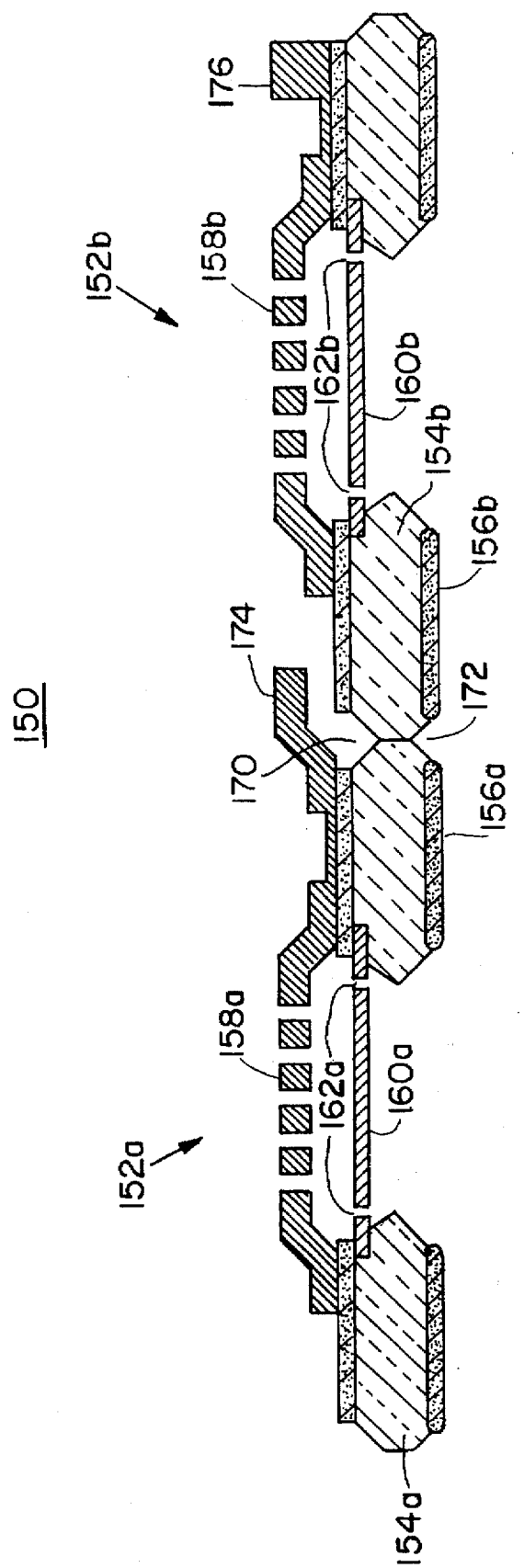
FIG. 8 is a schematic diagram of a portion of a wafer showing two chips formed on the wafer illustrating the V grooves, bump bonds and beam leads according to this invention.
Figure 9:
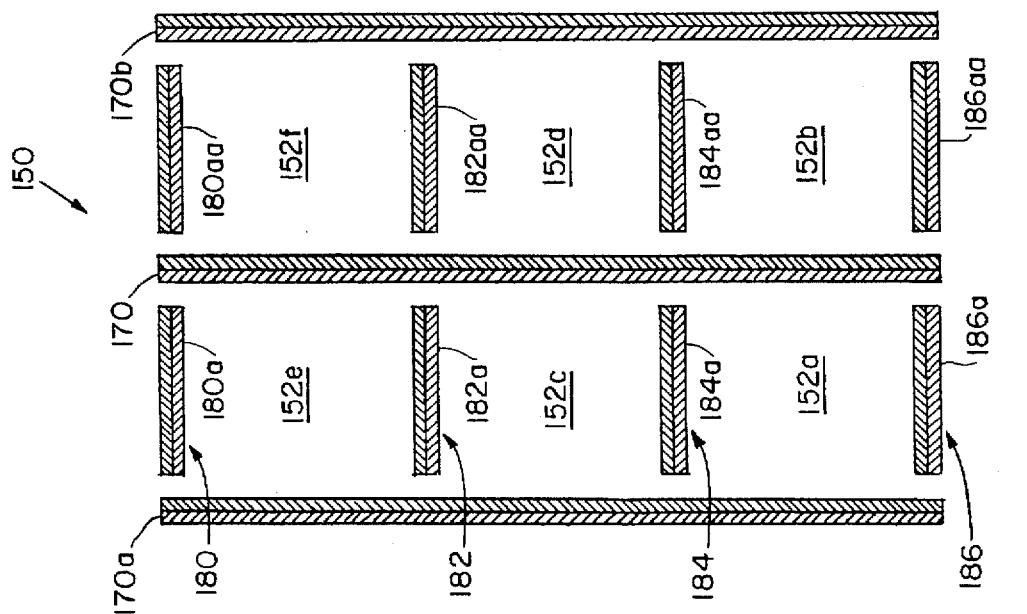
FIG. 9 is a top view of the wafer of FIG. 8 showing the longitudinal and latitudinal grooves in the top surface of the wafer.
Figure 11:
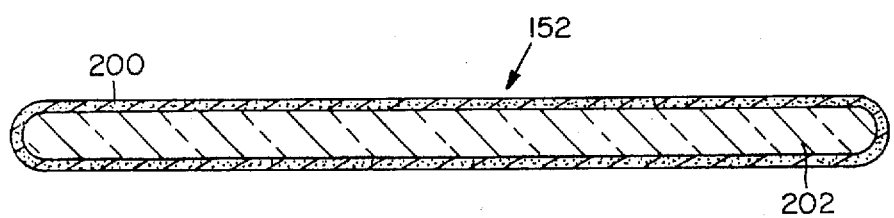
FIGS. 11–13 illustrate the steps in fabricating the V grooves on a wafer using a silicon oxide mask.

There is shown in FIG. 8 in accordance with this invention a wafer 150 containing a plurality of separable transducer chips 152a, 152b, each of which includes a substrate 154a, 154b, an etch stop layer 156a, 156b, a perforated bridge electrode 158a, 158b, and a flexible membrane 160a, 160b, with pressure equalization slots 162a, 162b. In accordance with this invention there are shown upper 170 and lower 172 V grooves as well as beam lead contact 174 on chip 152a and bump bond contact 176 on transducer chip 152b. The V grooves 172 and 174, may be any suitable shape but are preferably V shaped, being wider at the surface and getting narrower as they penetrate inwardly of substrate 154. Although on FIG. 8 there are grooves shown on both the bottom and the top surfaces of wafer 150, as indicated by grooves 172 and 170, this is not a necessary limitation of the invention as the grooves can be used on one side and one side only. The advantage of using them on both sides is that it permits the same amount of penetration while reducing the width that the grooves occupy on the surface of the wafer. Wafer 150 contains six transducer chips 152a–152f, as shown in the top plan view of FIG. 9, where details of the chip have been eliminated to show more clearly just the arrangement of the V grooves. Here it can be seen that V groove 170 is one of a number of longitudinally extending V grooves including grooves 170a and 170b, which extend continuously on the top surface of wafer 150. Extending across wafer 150 transverse to the longitudinal grooves 170, 170a, 170b are latitudinal grooves 180, 182, 184 and 186, each formed of a number of discontinuous parts 180a, 180aa, 182a, 182aa, 184a, 184aa, 186a, and 188a. Discontinuity is imposed in order to prevent undercutting during etching at the corners.

Figure 10:
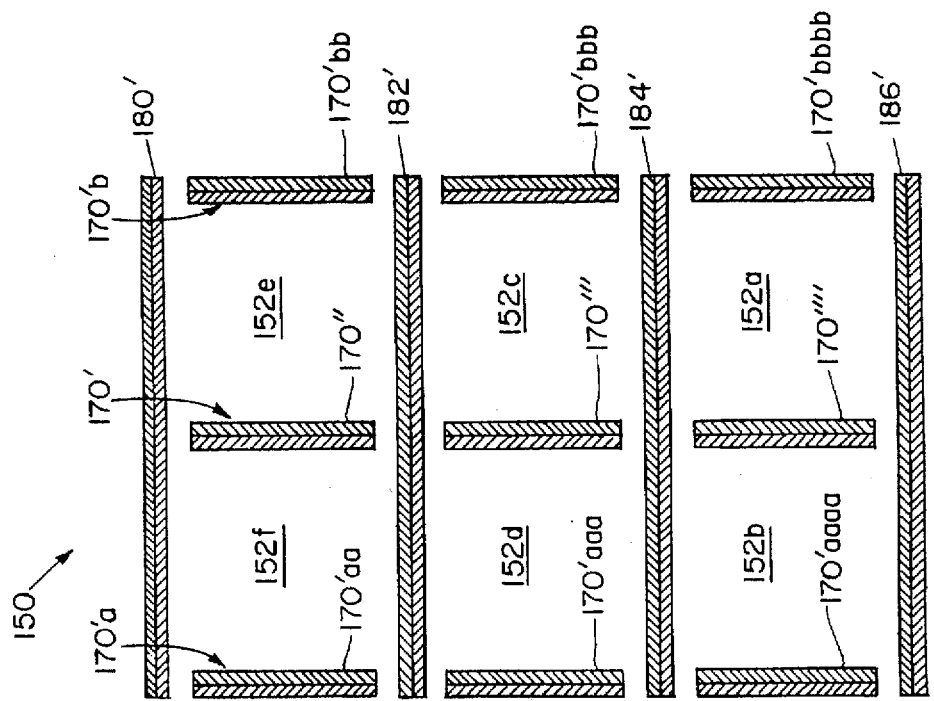
FIG. 10 is a view similar to FIG. 9 showing the corresponding grooves in the bottom of the wafer.

On the other, bottom side of wafer 150, FIG. 10, the latitudinal grooves 180', 182', 184', and 186' are continuous while the longitudinal grooves 170'a, 170', and 170'b, are broken into discontinuous parts 170'aa, 170'aaa, 170'aaaa, 170'', 170''', 170'''' and 170'bb, 170'bbb and 170'bbbb. Note that when there are grooves on both surfaces of wafer 150, longitudinal lines on each side align with each other and the latitudinal lines on each side align with each other, and the longitudinal lines are continuous on one side and the latitudinal lines are discontinuous on that side while on the other side the latitudinal lines are continuous and the longitudinal lines are discontinuous.

Figure 12:
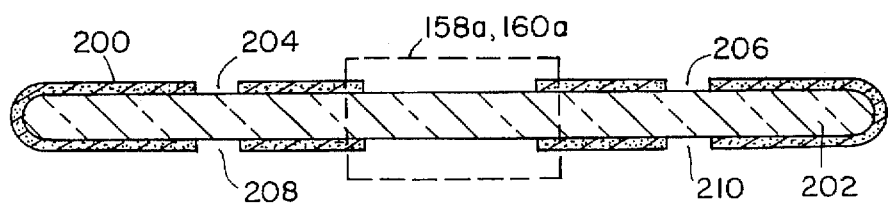
Figure 13:
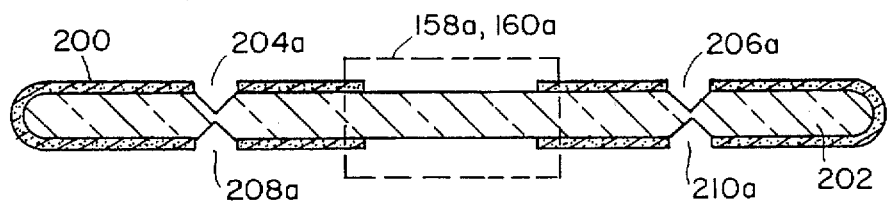

The method of making wafer 150 according to this invention is shown in a schematic form in FIGS. 11–16. An etch resistant layer 200, FIG. 11, approximately 0.05 to 1 micron thick, is grown on a silicon substrate 202. The etch resistant layer may be silicon dioxide or silicon nitride and is typically grown by chemical vapor deposition or thermal oxidation in steam or oxygen. Etch-resistant layer 200 is exposed photolithographically to define channels 204, 206 on the top surface of the wafer, and channels 208, 210 on the bottom surface of the wafer. The silicon in this region is etched away using an anisotropic etch such as ethylene-diamine-pyrocatechol (EDP) or potassium hydroxide. The channels 204, 206, 208, 210, FIG. 12, are now converted to V grooves 204a, 206a, 208a and 210a, FIG. 13.

Figure 14:
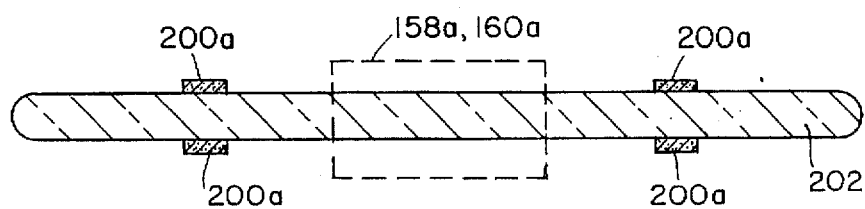
FIGS. 14–16 illustrate the steps in forming the V grooves on a wafer according to this invention using boron diffusion as the masking medium for the V groove fabrication.
Figure 15:
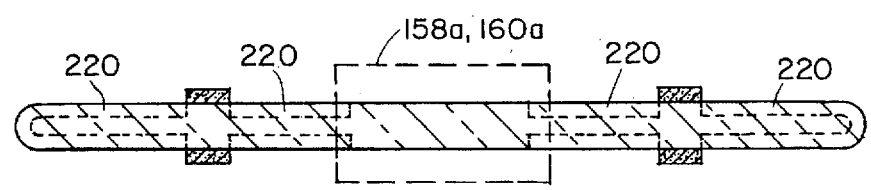
Figure 16:
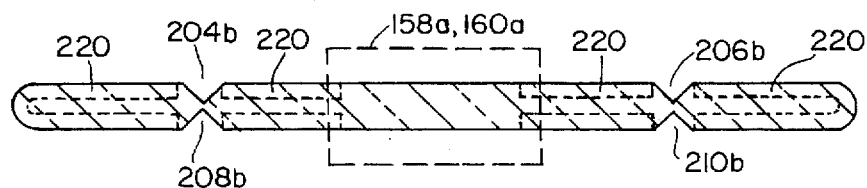

Alternatively, instead of using silicon oxide or silicon nitride to define the V grooves, a P++ heavily boron doped silicon region may be used instead as an etch resistant border to the V-grooves. This boron doped region is formed by diffusion of boron into the silicon at high temperature using a silicon dioxide mask to define the regions of the wafer to be boron diffused, as shown in FIG. 14, where the oxide masks 200a reside only over the areas where the grooves will be on substrate 202. The boron is diffused into the silicon creating P++ regions as indicated at 220, FIG. 15, after which the oxide is removed by etching using buffered HF. The grooves 204b, 206b, 208b, and 210b, FIG. 16, are once again created using an anisotropic etchant such as KOH or EDP.

Figure 18:
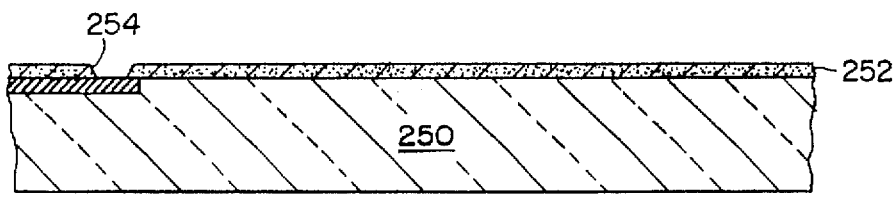
Figure 19:
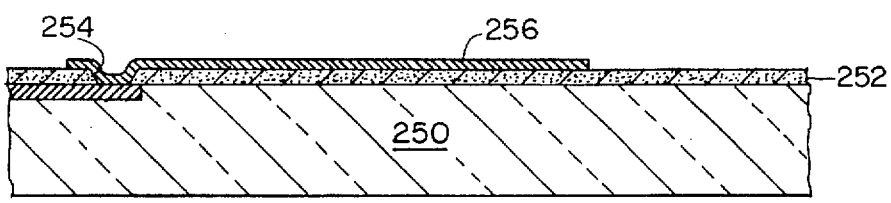
Figure 20:
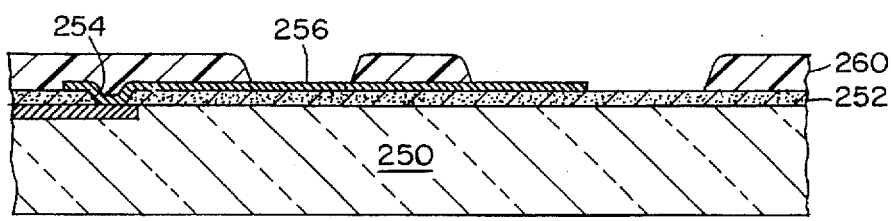

The invention also resides in the provision of beam leads 174, FIG. 8, and bump bonds 176. The beam leads extend above and beyond the edge of chip 152, FIG. 17, as indicated by beam leads 174, 174a, 174b and 174c. Such beam leads may be constructed starting with a silicon wafer 250, FIG. 18, with an insulator such as silicon dioxide 252 having one or more contact holes 254, through the silicon dioxide layer 252 to contact the transducer and circuits on board the wafer. A thin metal layer 256, FIG. 19, is then deposited in a pattern on oxide layer 252 for interconnecting the transducer, circuitry and bump bonds or beam leads. If a beam lead is being made, a sacrificial spacer layer 260, FIG. 20, of photoresist or other material is deposited in a pattern to define where the electro-plated layer is in contact with the substrate 250 and where it is separated by a gap equal in thickness to spacer layer 260. If a bump bond is being made, the spacer layer is not required.

Figure 21:
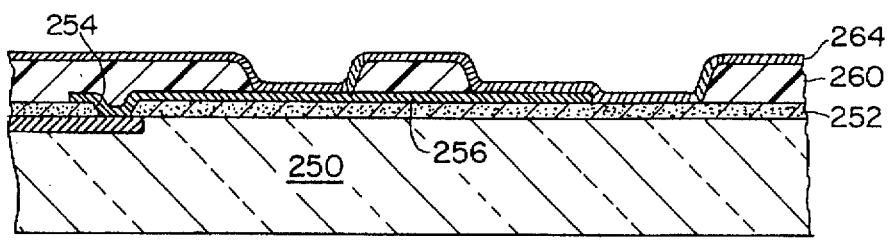
Figure 22:
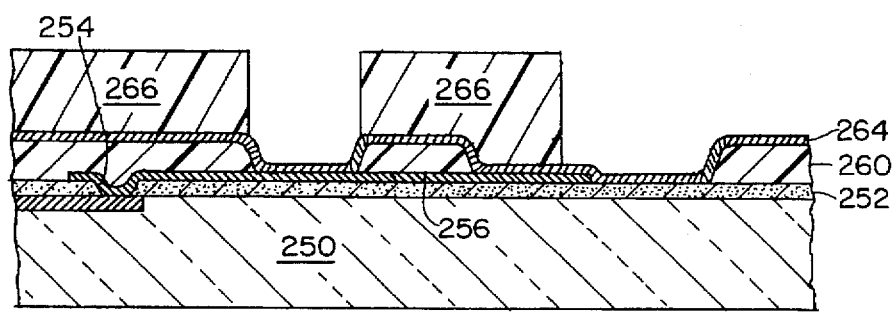

A second thin metal layer 264, FIG. 21, is applied to act as a plating base. A thick pattern of photoresist mask 266, FIG. 22, is then deposited to define the regions which will be plated. A thick layer of metal 268 is now electroplated to form a bump bond 270 and/or a beam lead 272, FIG. 23. After this the photoresist plating mask 266, the thin metal plating base 264, and the sacrificial spacing layer 260 are removed by a suitable etching or dissolution technique. If only bump bonds are being fabricated, the step of applying spacer layer 260, FIG. 20, may be eliminated. The bump bonds, in the absence of beam leads appear as shown on transducer chip 152', FIG. 25, at 270, 270a, 270b, and 270c, and as illustrated in cross-sectional view in FIG. 26.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A method of making a plurality of separable semiconductor transducer chips on a wafer, comprising:

applying an etch resistant mask to at least one surface of the wafer to define a grid of longitudinal and latitudinal channels to be etched;

applying an etchant to said wafer to etch into said channels a pattern of longitudinal and latitudinal grooves for separating said chips from each other and enabling them to be easily, individually severed from said wafer; and wherein said grooves are continuous in one of the longitudinal and latitudinal directions and discontinuous in the other to provide gaps which isolate the respective grooves for preventing undercutting of the corners.

2. The method of claim 1 in which said wafer is silicon.

3. The method of claim 1 in which said mask is formed from the group consisting of: silicon dioxide, silicon nitride, boron doped silicon, silicon carbide, titanium, palladium, platinum, and gold.

4. The method of claim 1 in which said etchant includes ethylene-diamide-pyrocatechol (EDP).

5. The method of claim 1 in which said etchant includes potassium hydroxide.

6. The method of claim 1 in which said grooves are "V" shaped being wider at the surface of the wafer and narrowing as they penetrate inwardly.

7. The method of claim 1 in which said grooves are disposed on both surfaces of said wafer.

8. The method of claim 1 in which said grooves are disposed on both surfaces of said wafer and said longitudinal and latitudinal grooves on each surface are aligned with like grooves on the other surface to reduce the width required for the grooves on the surface.

9. The method of claim 1 in which said longitudinal grooves are continuous and said latitudinal grooves are discontinuous on one surface of said wafer and said latitudinal grooves are continuous and said longitudinal grooves are discontinuous on the other surface.

10. A method of making a plurality of separable semiconductor transducer chips on a wafer, comprising:

applying an etch resistant mask to at least one surface of the wafer to define a grid of longitudinal and latitudinal channels to be etched;

applying an etchant to said wafer to etch into said channels a pattern of longitudinal and latitudinal grooves for separating said chips from each other and enabling them to be easily, individually severed from said wafer; and wherein said longitudinal grooves are continuous and said latitudinal grooves are discontinuous on one surface of said wafer and said latitudinal grooves are continuous and said longitudinal grooves are discontinuous on the other surface of the wafer.

* * * * *